United States Patent
Kim

(10) Patent No.: US 10,868,010 B2
(45) Date of Patent: Dec. 15, 2020

(54) LAYOUT STRUCTURE OF CMOS TRANSISTOR WITH IMPROVED INSERTION LOSS

(71) Applicant: SAMSUNG ELECTRO-MECHANICS CO., LTD., Suwon-si (KR)

(72) Inventor: Jong Myeong Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 16/358,179

(22) Filed: Mar. 19, 2019

(65) Prior Publication Data

US 2020/0066723 A1    Feb. 27, 2020

(30) Foreign Application Priority Data

Aug. 24, 2018 (KR) .................. 10-2018-0098965

(51) Int. Cl.
*H01L 27/092* (2006.01)
*H01L 29/10* (2006.01)

(52) U.S. Cl.
CPC ...... *H01L 27/0921* (2013.01); *H01L 29/1083* (2013.01)

(58) Field of Classification Search
CPC ................ H01L 27/0921; H01L 29/1083
See application file for complete search history.

(56) References Cited

U.S. PATENT DOCUMENTS

| | | | | |
|---|---|---|---|---|
| 5,384,477 A * | 1/1995 | Bulucea | ............ | H01L 27/0921 257/372 |
| 5,831,313 A * | 11/1998 | Han | ............ | H01L 21/76218 257/371 |
| 5,990,523 A * | 11/1999 | Hsia | ............ | H01L 27/0921 257/369 |
| 6,063,672 A * | 5/2000 | Miller | ............ | H01L 21/82342 257/E21.62 |
| 6,107,146 A * | 8/2000 | Gardner | ............ | H01L 21/26506 438/300 |
| 6,144,076 A * | 11/2000 | Puchner | ............ | H01L 21/76237 257/369 |
| 8,309,445 B2 * | 11/2012 | Chang | ............ | H01L 21/26586 438/252 |
| 9,755,647 B1 * | 9/2017 | Lee | ............ | H03K 19/17724 |
| 2004/0232497 A1 * | 11/2004 | Akiyama | ............ | H01L 27/1052 257/390 |
| 2005/0045953 A1 * | 3/2005 | Ando | ............ | H01L 27/0928 257/355 |
| 2008/0259511 A1 * | 10/2008 | Worley | ............ | H01L 27/0266 361/56 |

(Continued)

*Primary Examiner* — Nathan W Ha
(74) *Attorney, Agent, or Firm* — NSIP Law

(57) ABSTRACT

A complementary metal oxide semiconductor (CMOS) device includes a high-resistivity substrate; a first CMOS structure disposed in a first region of the high-resistivity substrate; and a second CMOS structure of a same semiconductor type as the first CMOS structure and disposed in a second region of the high-resistivity substrate spaced apart from the first region. The high-resistivity substrate is disposed between the first CMOS structure and the second CMOS structure to separate the first CMOS structure from the second CMOS structure.

24 Claims, 6 Drawing Sheets

(56) References Cited

U.S. PATENT DOCUMENTS

| | | | |
|---|---|---|---|
| 2009/0160531 A1* | 6/2009 | Law | H03K 19/0013 327/534 |
| 2009/0201742 A1* | 8/2009 | Lee | H01L 29/42324 365/185.24 |
| 2010/0207173 A1* | 8/2010 | Anderson | H01L 29/1058 257/270 |
| 2011/0049631 A1* | 3/2011 | Itaka | H01L 21/823892 257/351 |
| 2012/0013384 A1* | 1/2012 | Fischer | H03K 5/08 327/321 |
| 2012/0175708 A1* | 7/2012 | Schuetz | H01L 21/823892 257/369 |
| 2015/0071466 A1* | 3/2015 | Lasseuguette | H03F 1/0266 381/111 |
| 2018/0158912 A1* | 6/2018 | Han | H01L 21/823892 |
| 2019/0386098 A1* | 12/2019 | Secareanu | H01L 29/0646 |
| 2020/0135583 A1* | 4/2020 | Saha | H01L 29/1083 |
| 2020/0135863 A1* | 4/2020 | Han | H01L 29/78645 |

\* cited by examiner

LAYOUT STRUCTURE OF CMOS TRANSISTOR WITH IMPROVED INSERTION LOSS

CROSS-REFERENCE TO RELATED APPLICATION

This application claims the benefit under 35 U.S.C. § 119(a) of Korean Patent Application No. 10-2018-0098965 filed on Aug. 24, 2018 in the Korean Intellectual Property Office, the entire disclosure of which is incorporated herein by reference for all purposes.

BACKGROUND

1. Field

The following description relates to a layout structure of a complementary metal oxide semiconductor (CMOS) transistor with improved insertion loss.

2. Description of Background

Recently developed mobile Wi-Fi modules are configured to perform 2.4 GHz/5 GHz dual-band multiple-input multiple-output (MIMO) communications, and miniaturization and integrated design of the Wi-Fi module is required for suitability with mobile devices.

Also, a front-end integrated circuit (FEIC) including a power amplifier (PA), an internal-coupler, a radio frequency (RF) switch, and a low noise amplifier (LNA) in one chip is required. To this end, a front-end circuit, configured as two chips by separating the conventional transmission and reception, has recently been configured as a single chip using a single process.

In the case in which the front-end integrated circuit (FEIC) is formed as a single chip as described above, although a SOI (Silicon-on-Insulator) process may be used to maximize the characteristics of the radio frequency switch embedded therein, when the SOI process is used, it is very difficult to design the power amplifier. Therefore, a BiCMOS process may be used to configure a transmitter and a receiver as a single chip.

However, the BiCMOS process has switching loss greater than that of the SOI process, which may directly affect the receiving performance of the receiver and the output power of the transmitter. Therefore, in order to solve such a problem, a structure capable of reducing switching loss is required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a CMOS device includes: a high-resistivity substrate; a first CMOS structure disposed in a first region of the high-resistivity substrate; and a second CMOS structure of a same semiconductor type as the first CMOS structure and disposed in a second region the high-resistivity substrate spaced apart from the first region. The high-resistivity substrate is disposed between the first CMOS structure and the second CMOS structure to separate the first CMOS structure from the second CMOS structure.

Each of the first and second CMOS structures may be a triple well structure.

The first CMOS structure may include a first low-resistivity layer, a first deep N-well layer, and a first P-well layer stacked in a first triple well structure.

The second CMOS structure may include a second low-resistivity layer, a second deep N-well layer and a second P-well layer stacked in a second triple well structure.

The first CMOS structure may include a first low-resistivity layer stacked in a first region of the high-resistivity substrate; a first deep N-well layer disposed on the first low-resistivity layer and surrounded by the first low-resistivity layer; a first P-well layer disposed on the first deep N-well layer and surrounded by the first deep N-well layer; and a first source region, a first drain region, and a first gate region disposed in the first P-well layer to form a source, a drain, and a gate of the first CMOS structure, respectively.

The second CMOS structure may include a second low-resistivity layer stacked in the second region of the high-resistivity substrate; a second deep N-well layer disposed on the second low-resistivity layer and surrounded by the second low-resistivity layer; a second P-well layer disposed on the second deep N-well layer and surrounded by the second deep N-well layer; and a second source region, a second drain region, and a second gate region disposed in the second P-well layer to form a source, a drain, and a gate of the second CMOS structure, respectively.

The high-resistivity substrate may have a resistivity value greater than both a resistivity value of the first low-resistivity layer and a resistivity value of the second low-resistivity layer.

A thickness of the high-resistivity substrate may be thicker than both a thickness of the first low-resistivity layer and a thickness of the second low-resistivity layer, and may be thinner than both a total thickness of the first low-resistivity layer and the first deep N-well layer and a total thickness of the second low-resistivity layer and the second deep N-well layer.

In another general aspect, a CMOS device includes: a high-resistivity substrate; a first CMOS structure of a first triple well structure disposed in a first region of the high-resistivity substrate; and a second CMOS structure of a second triple well structure disposed in a second region of the high-resistivity substrate spaced apart from the first region. The high-resistivity substrate is disposed between the first triple well structure and the second triple well structure to separate the first triple well structure from the second triple well structure.

The first CMOS structure may be a same semiconductor type as the second CMOS structure.

The first triple well structure of the first CMOS structure may include a first low-resistivity layer, a first deep N-well layer, and a first P-well layer that are stacked.

The second triple well structure of the second CMOS structure may include a second low-resistivity layer, a second deep N-well layer and a second P-well layer that are stacked.

The first CMOS structure may include a first low-resistivity layer stacked in the first region of the high-resistivity substrate; a first deep N-well layer disposed on the first low-resistivity layer and surrounded by the first low-resistivity layer; a first P-well layer disposed on the first deep N-well layer and surrounded by the first deep N-well layer; and a first source region, a first drain region, and a first gate region disposed in the first P-well layer to form a source, a drain, and a gate of the first CMOS structure, respectively.

The second CMOS structure may include a second low-resistivity layer stacked in the second region of the high-resistivity substrate; a second deep N-well layer disposed on the second low-resistivity layer and surrounded by the second low-resistivity layer; a second P-well layer disposed on the second deep N-well layer and surrounded by the second deep N-well layer; and a second source region, a second drain region, and a second gate region disposed in the second P-well layer to form a source, a drain, and a gate of the second CMOS structure respectively.

The high-resistivity substrate may have a resistivity value greater than both a resistivity value of the first low-resistivity layer and a resistivity value of the second low-resistivity layer.

A thickness of the high-resistivity substrate may be thicker than both a thickness of the first low-resistivity layer and a thickness of the second low-resistivity layer, and may be thinner than both a total thickness of the first low-resistivity layer and the first deep N-well layer and a total thickness of the second low-resistivity layer and the second deep N-well layer.

A complementary metal oxide semiconductor (CMOS) device includes a substrate; a first CMOS structure disposed in the substrate and including a first layer; and a second CMOS structure disposed in the substrate and including a second layer spaced apart from the first layer by a portion of the substrate disposed between the first layer and the second layer. The portion of the substrate has a resistivity higher than both a resistivity of the first layer and a resistivity of the second layer.

A thickness of the portion of the substrate disposed between the first layer and the second layer may be greater than a thickness of portions of the substrate other than the portion of the substrate disposed between the first layer and the second layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
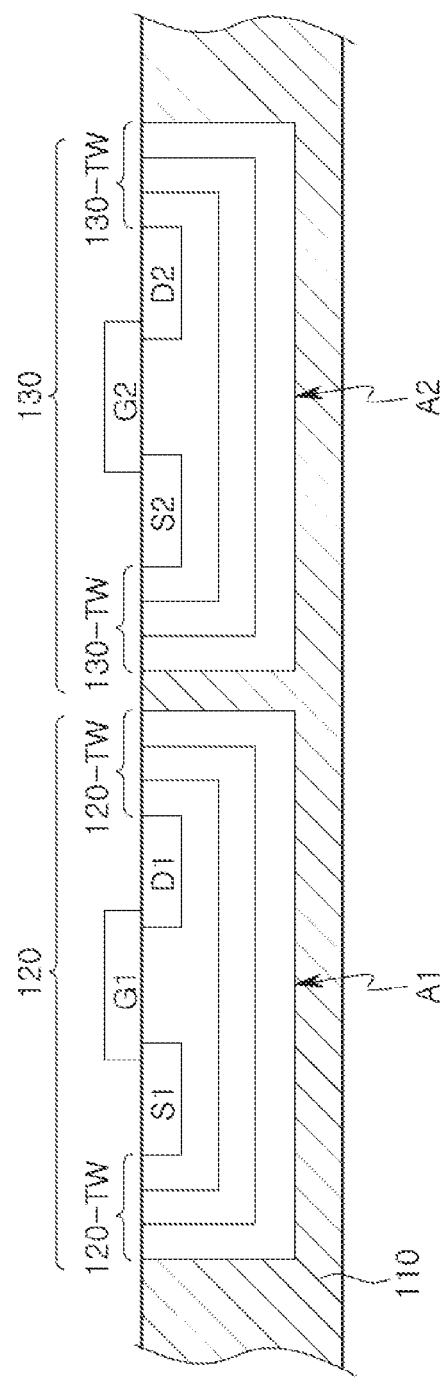
FIG. 1 is a cross-sectional view illustrating a layout structure of a complementary metal oxide semiconductor (CMOS) transistor according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Hereinafter, examples will be described in detail with reference to the accompanying drawings.

FIG. 1 is a cross-sectional view illustrating a layout structure of a complementary metal oxide semiconductor (CMOS) transistor according to an example.

Referring to FIG. 1, the layout structure of the CMOS transistor includes at least two of first and second CMOS structures 120 and 130 in the layout structure of the CMOS transistor including a plurality of CMOS structures.

The layout structure of the CMOS transistor may include a high-resistivity substrate 110, a first CMOS structure 120, and a second CMOS structure 130.

The high-resistivity substrate 110 includes a high-resistivity region.

The first CMOS structure 120 may be formed in a first region A1 of an upper portion of the high-resistivity substrate 110 among the plurality of CMOS structures and formed as a first triple well structure 120-TW having three well layers.

The second CMOS structure 130 may be formed in a second region A2 of the upper portion of the high-resistivity substrate 110 among the plurality of CMOS structures. The second region A2 is spaced apart from the first region A1. The second CMOS structure 130 may be formed as a second triple well structure 130-TW having three well layers.

The high-resistivity substrate 110 may be formed between the first CMOS structure 120 and the second CMOS structure 130 to separate the first CMOS structure 120 and the second CMOS structure 130 from each other. The high-resistivity substrate 110 may be formed between the first triple well structure 120-TW and the second triple well structure 130-TW to separate the first triple well structure 120-TW and the second triple well structure 130-TW from each other.

In FIGS. 1, 51, G1 and D1 respectively are first source, first gate and first drain regions of the first CMOS structure 120 corresponding to a first transistor, and S2, G2 and D2 respectively are second source, second gate and second drain regions of the second CMOS structure 130 corresponding to a second transistor.

For each of the drawing figures, unnecessary redundant explanations may be omitted for components having the same reference numeral and the same function, and differences for each figure may be explained.

Figure 2:
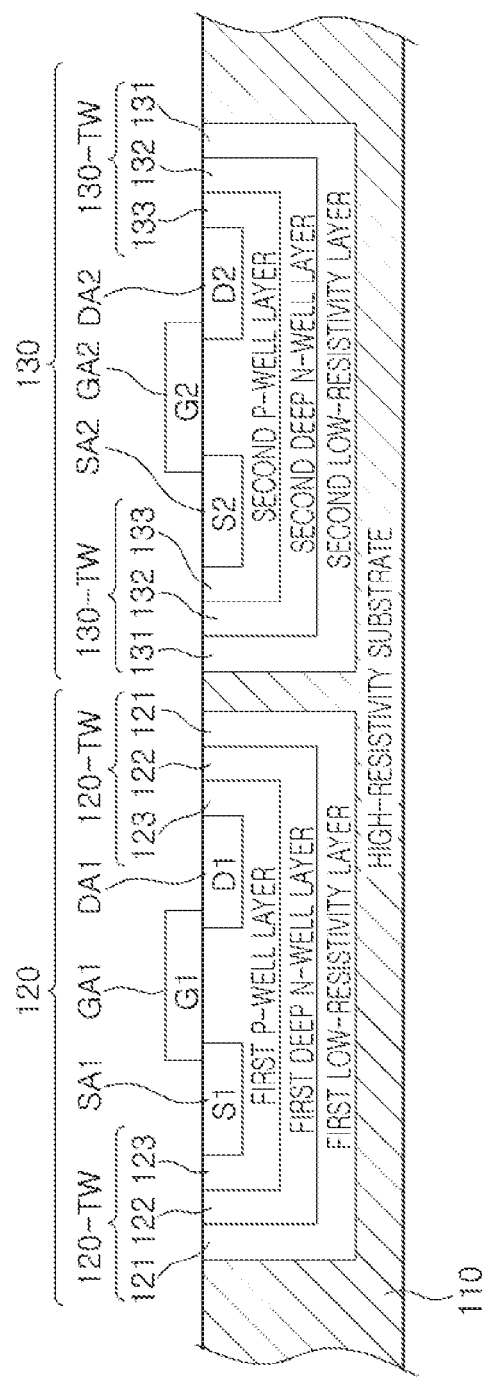
FIG. 2 is a cross-sectional view illustrating a layout structure of a CMOS transistor according to an example.

FIG. 2 is a cross-sectional view illustrating a layout structure of a CMOS transistor according to an example.

Referring to FIG. 2, the first triple well structure 120-TW of the first CMOS structure 120 may include a first low-resistivity layer 121, a first deep N-well layer 122, and a first P-well layer 123 that are stacked.

The first low-resistivity layer 121 may have a well structure stacked in the first region A1 of an upper portion of the high-resistivity substrate 110 among a plurality of CMOS structures. The first low-resistivity layer 121 may have a resistivity value that is relatively smaller than a resistivity value of the high-resistivity substrate 110. For example, the resistivity value of the first low-resistivity layer 121 may be 50 ohms ($\Omega$).

The first deep N-well layer 122 may be formed on an upper portion of the first low-resistivity layer 121 and may have a well structure surrounded by the first low-resistivity layer 121. For example, the first deep N-well layer 122 is an N-type doped region. The well structure of the first deep N-well layer 122 has a well shape as a whole by forming N-type doped columns vertically on both sides after N-type doping is performed horizontally. This is an example of forming one well structure and the formation of the first deep N-well layer 122 is not limited to such a method.

The first P-well layer 123 may be formed on an upper portion of the first deep N-well layer 122 and may have a well structure surrounded by the first deep N-well layer 122. For example, the first P-well layer 123 is a P-type doped region as a body region of a CMOS structure.

Each of the first low-resistivity layer 121, the first deep N-well layer 122, and the first P-well layer 123 is formed in the well structure and measured to each other to eventually form a triple well structure.

A first source region SA1, a first drain region DA1, and a first gate region GA1 respectively forming a source, a drain, and a gate of the first CMOS structure 120 may be formed in and on an upper portion of the first P-well layer 123.

For example, the high-resistivity substrate 110 has a resistivity value larger than that of the first low-resistivity layer 121. For example, the resistivity value of the high-resistivity substrate 110 may be 1 kilohm (k$\Omega$).

The second triple well structure 130-TW of the second CMOS structure 130 may include a second low-resistivity layer 131, a second deep N-well layer 132, and a second P-well layer 133 that are stacked.

The second low-resistivity layer 131 may have a well structure stacked in the second region A2 of the upper portion of the high-resistivity substrate 110 among the plurality of CMOS structures. The second low-resistivity layer 131 may have a resistivity value that is relatively smaller than the resistivity value of the high-resistivity substrate 110. For example, the resistivity value of the second low-resistivity layer 131 may be 50 ohms ($\Omega$).

The second deep N-well layer 132 may be formed on the upper portion of the second low-resistivity layer 131 and may have a well structure surrounded by the second low-resistivity layer 131. For example, the second deep N-well layer 132 is an N-type doped region. The well structure of the second deep N-well layer 132 has a well shape as a whole by forming N-type doped columns vertically on both sides after N-type doping is performed horizontally. This is an example of forming one well structure and the formation of the second deep N-well layer 132 is not limited to such a method.

The second P-well layer 133 may be formed on the upper portion of the second deep N-well layer 132 and may have a well structure surrounded by the second deep N-well layer 122. For example, the second P-well layer 133 is a P-type doped region as a body region of a CMOS structure.

Each of the second low resistive layer 131, the second deep N-well layer 132, and the second P-well layer 133 is formed in the well structure and measured to each other to eventually form a triple well structure.

A second source region SA2, a second drain region DA2, and a second gate region GA2 respectively forming a source, a drain, and a gate of the second CMOS structure 130 may be formed in and on the upper portion of the second P-well layer 133.

For example, the high-resistivity substrate 110 has a resistivity value larger than that of the second low-resistivity layer 131. For example, the resistivity value of the high-resistivity substrate 110 may be 1 kilohm (kΩ).

Referring to FIGS. 1 and 2, the CMOS transistor using a BiCMOS process including the high-resistivity substrate 110 and the first low-resistivity layer 121, and the high-resistivity substrate 110 and the second low-resistivity layer 131 may be mainly formed in an N-type MOS.

In the BiCMOS process, there is a process using the high-resistivity substrate 110 to improve the performance. When this process is used, most of the region of the high-resistivity substrate 110 is only a high-resistivity region, and the first and second CMOS structures 120 and 130 which may be used as switches include the first and second low-resistivity layers 121 and 131 having a low-resistivity region formed on the high-resistivity substrate 110, and transistor terminals of the first and second CMOS structures 120 and 130 are formed on the first and second low-resistivity layers 121 and 131.

Also, referring to FIGS. 1 and 2, the adjacent first and second CMOS structures 120 and 130 of the CMOS structure generally do not share a P-well layer in which a terminal region is formed because a signal is leaked through the P-well layer when the P-well layer is shared and used, and noise may also enter and exit through the P-well layer such that a transistor used for an RF signal may be formed in a triple-well structure including a deep N-well layer that double surrounds the P-well layer and a low-resistivity layer.

In the CMOS transistor having the triple-well structure, the deep N-well layer of the triple-well structure may also reduce signal leakage and noise entrance and exit, but may still have a limitation in reduction ability. That is, a transistor circuit of the CMOS structure of the triple-well structure still causes the signal leakage.

To further prevent such a signal leakage and improve insertion loss, the first and second CMOS structures 120 and 130 independently include the first low-resistivity layer 121 and the second low-resistivity layer 131, and the high-resistivity substrate 110 is placed between the first low-resistivity layer 121 and the second low-resistivity layer 131, and thus low-resistivity layers of transistors arranged in group may be separated from each other, and accordingly, interference between grouped or stacked transistors may be reduced, and the insertion loss may be reduced.

To prevent turn-on of a PN junction between the first deep N-well layer 122 and the first P-well layer 123, an operation voltage VDD may be connected to the first deep N-well layer 122 and a ground potential may be connected to the first P-well layer 123.

To prevent turn-on of a PN junction between the second deep N-well layer 132 and the second P-well layer 133, the operation voltage VDD may be connected to the second deep N-well layer 132 and the ground potential may be connected to the second P-well layer 133.

Figure 3:
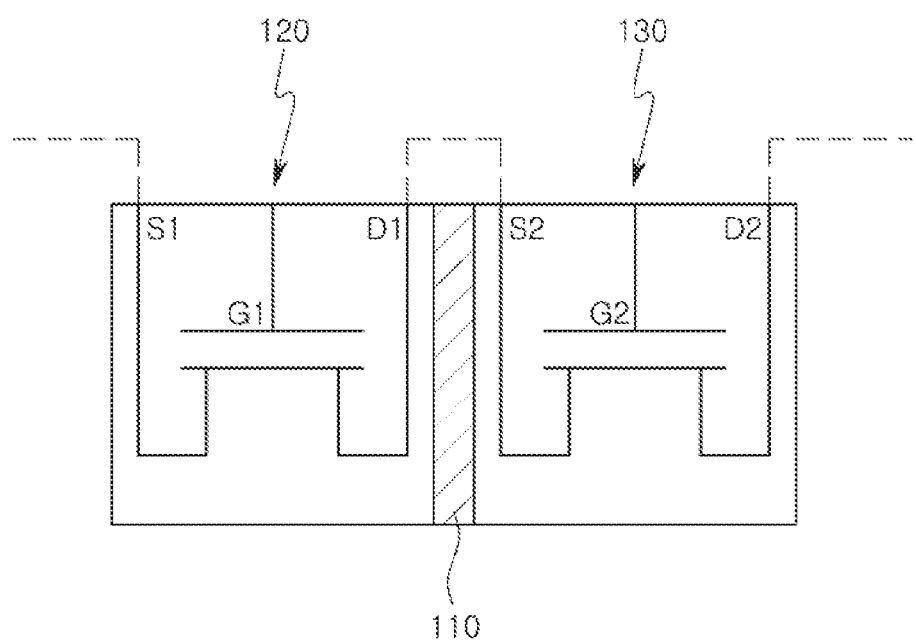
FIG. 3 is a circuit diagram of a CMOS transistor according to an example.

FIG. 3 is a circuit diagram of a CMOS transistor according to an example.

Referring to FIG. 3, a transistor of the first CMOS structure 120 and a transistor of the second CMOS structure 130 are physically separated from each other by the high-resistivity substrate 110, and thus interference therebetween may be reduced by the high-resistivity substrate 110, thereby improving insertion loss.

Figure 4:
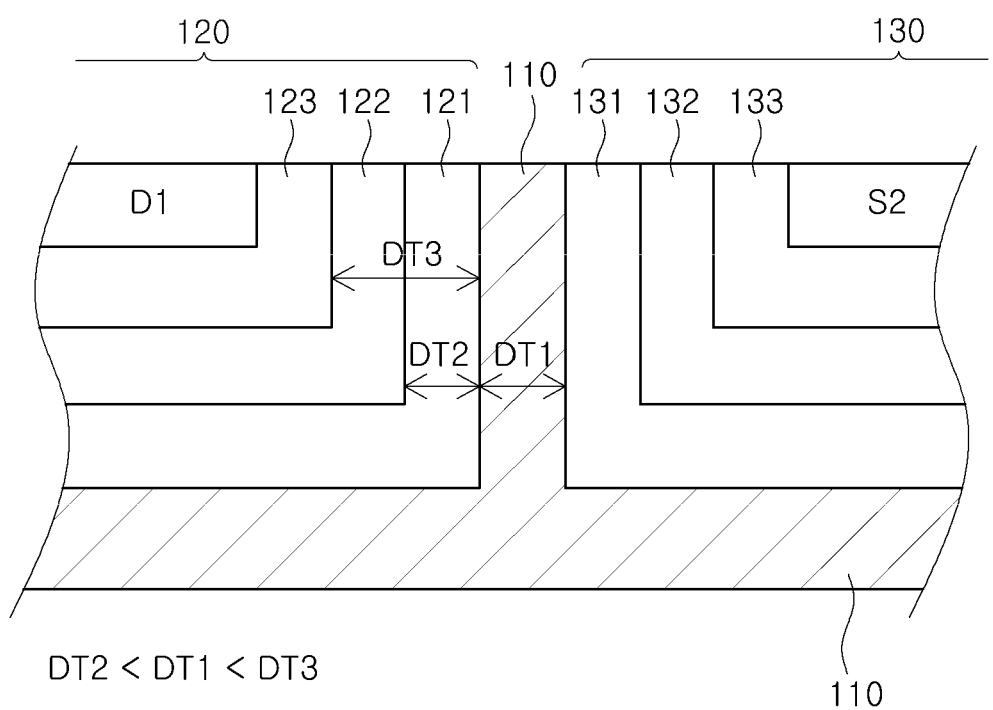
FIG. 4 is a view illustrating a thickness of a high-resistivity substrate according to an example.

FIG. 4 is a view illustrating a thickness of a high-resistivity substrate according to an example.

Referring to FIG. 4, a thickness DT1 of the high-resistivity substrate 110 (in a region between the first low-resistivity layer 121 and the second low-resistivity layer 131) may be thinner than, the same as, or thicker than a thickness DT2 of the first low-resistivity layer 121. For example, when the thickness DT1 of the high-resistivity substrate 110 is thicker than the thickness DT2 of the first low-resistivity layer 121, an interference elimination performance between the first CMOS structure 120 and the second CMOS structure 130 may be further improved by the high-resistivity substrate 110.

For example, the thickness DT1 of the high-resistivity substrate 110 may be thinner than a total thickness DT3 of the first low-resistivity layer 121 and the first deep N-well layer 122.

For example, the thickness DT1 of the high-resistivity substrate 110 may be thicker than the thickness DT2 of the second low-resistivity layer 131.

For example, the thickness DT1 of the high-resistivity substrate 110 may be thinner than the total thickness of the second low-resistivity layer 131 and the second deep N-well layer 132.

Although not shown in the figure, the thickness DT1 of a high-resistivity region of the high-resistivity substrate 110 disposed between the first low-resistivity layer 121 and the second low-resistivity layer 131 may be thinner than, the same as, or thicker than a thickness of a high-resistivity region of the high-resistivity substrate 110 in a region other than between the first low-resistivity layer 121 and the second low-resistivity layer 131. However, for example, when the thickness DT1 is thicker than the thickness in the region other than between the first low-resistivity layer 121 and the second low-resistivity layer 131, an interference elimination performance between the first CMOS structure 120 and the second CMOS structure 130 may be further improved by the high-resistivity substrate 110.

Figure 5:
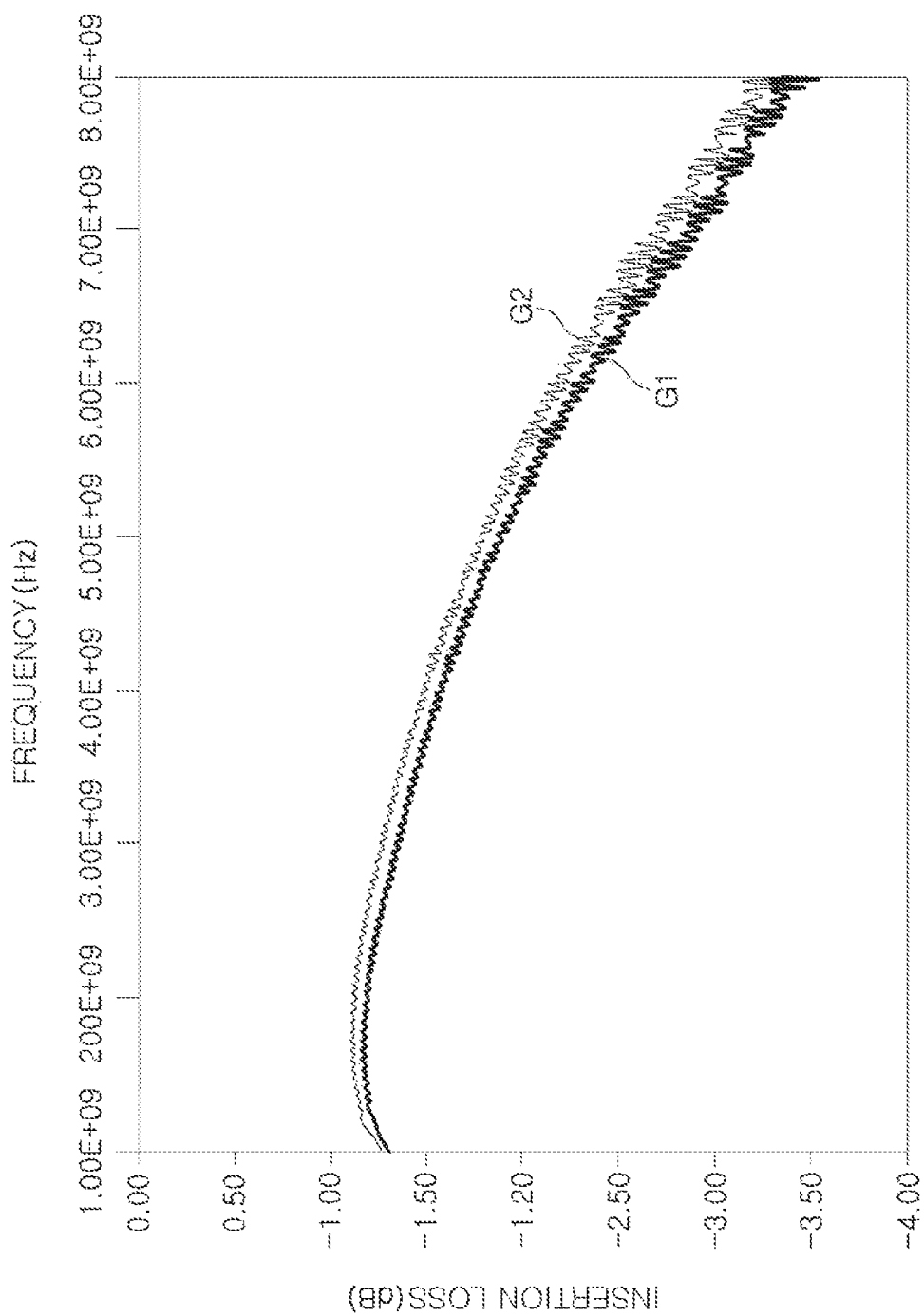
FIG. 5 is a graph illustrating insertion loss characteristics of a switch circuit to which a CMOS transistor is applied according to an example.

FIG. 5 is a graph illustrating insertion loss characteristics of a switch circuit to which a CMOS transistor is applied according to an example.

In FIG. 5, G1 is a graph showing insertion loss characteristics of a switch circuit to which a conventional CMOS transistor is applied, and G2 is a graph showing insertion loss characteristics of a switch circuit to which a CMOS transistor according to an exampled described herein is applied.

Referring to G1 and G2, it may be seen that the insertion loss characteristics of the switch circuit to which the CMOS transistor according to an example is applied are improved as compared with the insertion loss characteristics of the switch circuit to which the conventional CMOS transistor is applied.

Figure 6:
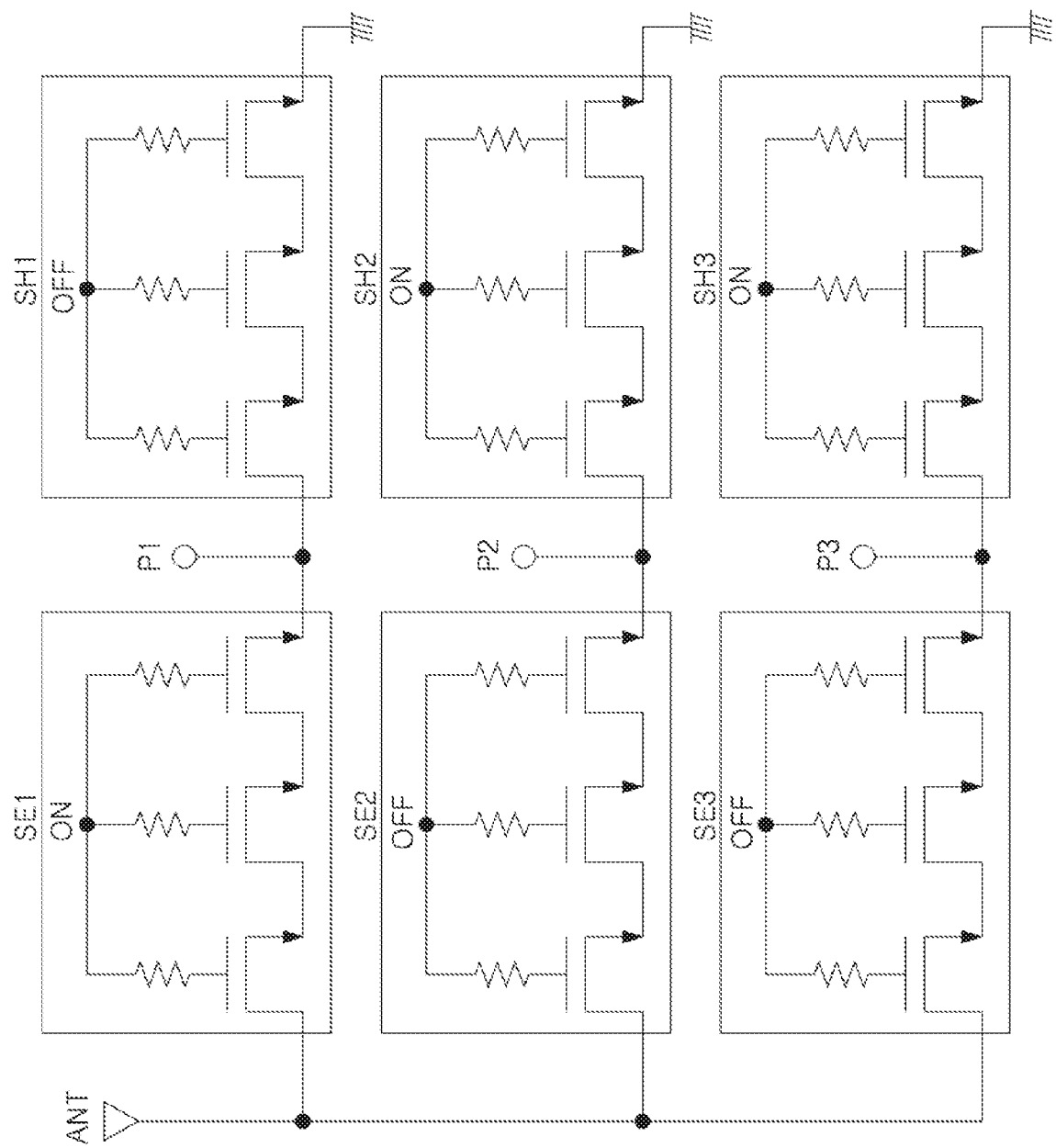
FIG. 6 is a view illustrating an application of a CMOS transistor according to an example.

FIG. 6 is a view illustrating an application of a CMOS transistor according to an example.

Referring to FIG. 6, the CMOS transistor is applied to a radio-frequency switch included in a front-end circuit (or module).

The radio-frequency switch shown in FIG. 6 may include, for example, a first series switch SE1 connected between an antenna ANT and a first port P1, a second series switch SE2 connected between the antenna ANT and a second port P2, a third series switch SE3 connected between the antenna ANT and a third port P3, a first shunt switch SH1 connected between the first port P1 and the ground, a second shunt switch SH2 connected between the second port P2 and the ground, and a third shunt switch SH3 connected between the third port P3 and the ground.

The transistor of the CMOS structure may be applied to each of the first, second and third series switches SE1, SE2 and SE3 and the first, second and third shunt switches SH1, SH2 and SH3.

As set forth above, among CMOS transistors by a BiC-MOS process in which a high-resistivity region and a low-resistivity region are separated from each other, by disposing the high-resistivity region between two CMOS transistors adjacent to each other among a plurality of stacked or grouped CMOS transistors, insertion loss may be improved by reducing an interference between the CMOS transistors.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A complementary metal oxide semiconductor (CMOS), device comprising:
    a substrate having a first resistivity;
    a first CMOS structure disposed in a first region of the substrate and comprising a portion having a second resistivity smaller than the first resistivity; and
    a second CMOS structure of a same semiconductor type as the first CMOS structure disposed in a second region of the substrate spaced apart from the first region and comprising a portion having a third resistivity smaller than the first resistivity,
    wherein a portion of the substrate is disposed between the first CMOS structure and the second CMOS structure to separate the first CMOS structure from the second CMOS structure.

2. The CMOS device of claim 1, wherein the first CMOS structure comprises a first triple well structure comprising the portion having the second resistivity, and
    the second CMOS structure comprises a second triple well structure comprising the portion having the third resistivity.

3. The CMOS device of claim 1, wherein the first CMOS structure comprises a first layer having the second resistivity and constituting the portion having the second resistivity, a first deep N-well layer, and a first P-well layer stacked in a first triple well structure.

4. The CMOS device of claim 1, wherein the second CMOS structure comprises a second layer having the third resistivity and constituting the portion having the third resistivity, a second deep N-well layer, and a second P-well layer stacked in a second triple well structure.

5. The CMOS device of claim 2, wherein the first triple well structure comprises:
    a first layer having the second resistivity disposed in the first region of the substrate and constituting the portion having the second resistivity;
    a first deep N-well layer disposed in the first layer and surrounded by the first layer;
    a first P-well layer disposed in the first deep N-well layer and surrounded by the first deep N-well layer;
    a first source region and a first drain region disposed in the first P-well layer to respectively form a source and a drain of the first CMOS structure; and
    a first gate region disposed on the first P-well layer, the first source region, and the first drain region to form a gate of the first CMOS structure.

6. The CMOS device of claim 5, wherein the second triple well structure comprises:
    a second layer having the third resistivity disposed in the second region of the substrate and constituting the portion having the third resistivity;
    a second deep N-well layer disposed in the second layer and surrounded by the second layer;
    a second P-well layer disposed in the second deep N-well layer and surrounded by the second deep N-well layer;
    a second source region and a second drain region disposed in the second P-well layer to respectively form a source and a drain of the second CMOS structure; and
    a second gate region disposed on the second P-well layer, the second source region, and the second drain region to form a gate of the second CMOS structure.

7. The CMOS device of claim 6, wherein a thickness of the portion of the substrate disposed between the first CMOS structure and the second CMOS structure is greater than both a thickness of the first layer and a thickness of the second layer, and
    the thickness of the portion of the substrate disposed between the first CMOS structure and the second CMOS structure is smaller than both a total thickness of the first layer and the first deep N-well layer and a total thickness of the second layer and the second deep N-well layer.

8. The CMOS device of claim 1, wherein the portion of the substrate contacts the portion having the second resistivity and the portion having the third resistivity.

9. The CMOS device of claim 3, wherein a portion of the first layer, a portion of the first deep N-well layer, and a portion of the first P-well layer are flush with a surface of the substrate.

10. The CMOS device of claim 4, wherein a portion of the second layer, a portion of the second deep N-well layer, and a portion of the second P-well layer are flush with a surface of the substrate.

11. A complementary metal oxide semiconductor (CMOS) device comprising:
    a substrate having a first resistivity;
    a first CMOS structure comprising a first triple well structure disposed in a first region of the substrate, the first triple-well structure comprising a portion having a second resistivity smaller than the first resistivity; and
    a second CMOS structure comprising a second triple well structure disposed in a second region of the substrate spaced apart from the first region, the second triple-well structure comprising a portion having a third resistivity smaller than the first resistivity,
    wherein a portion of the substrate is disposed between the first triple well structure and the second triple well structure to separate the first triple well structure from the second triple well structure.

12. The CMOS device of claim 11, wherein the first CMOS structure is a same semiconductor type as the second CMOS structure.

13. The CMOS device of claim 11, wherein the first triple well structure of the first CMOS structure comprises a first layer having the second resistivity and constituting the portion having the second resistivity, a first deep N-well layer, and a first P-well layer that are stacked.

14. The CMOS device of claim 11, wherein the second triple well structure of the second CMOS structure comprises a second layer having the third resistivity and constituting the portion having the third resistivity, a second deep N-well layer, and a second P-well layer that are stacked.

15. The CMOS device of claim 12, wherein the first CMOS structure comprises:
a first layer having the second resistivity disposed in the first region of the substrate and constituting the portion having the second resistivity;
a first deep N-well layer disposed in the first layer and surrounded by the first layer;
a first P-well layer disposed in the first deep N-well layer and surrounded by the first deep N-well layer;
a first source region and a first drain region disposed in the first P-well layer to respectively form a source and a drain of the first CMOS structure; and
a first gate region disposed on the first P-well layer, the first source region, and the first drain region to form a gate of the first CMOS structure.

16. The CMOS device of claim 15, wherein the second CMOS structure comprises:
a second layer having the third resistivity disposed in the second region of the substrate and constituting the portion having the third resistivity;
a second deep N-well layer disposed in the second layer and surrounded by the second layer;
a second P-well layer disposed in the second deep N-well layer and surrounded by the second deep N-well layer;
a second source region and a second drain region disposed in the second P-well layer to respectively form a source and a drain of the second CMOS structure; and
a second gate region disposed on the second P-well layer, the second source region, and the second drain region to form a gate of the second CMOS structure.

17. The CMOS device of claim 16, wherein a thickness of the substrate is greater than both a thickness of the first layer and a thickness of the second layer, and
the thickness of the substrate is smaller than both a total thickness of the first layer and the first deep N-well layer and a total thickness of the second layer and the second deep N-well layer.

18. The CMOS device of claim 11, wherein the portion of the substrate contacts the portion having the second resistivity and the portion having the third resistivity.

19. The CMOS device of claim 13, wherein a portion of the first layer, a portion of the first deep N-well layer, and a portion of the first P-well layer are flush with a surface of the substrate.

20. The CMOS device of claim 14, wherein a portion of the second layer, a portion of the second deep N-well layer, and a portion of the second P-well layer are flush with a surface of the substrate.

21. A complementary metal oxide semiconductor (CMOS) device comprising:
a substrate;
a first CMOS structure disposed in the substrate and comprising a first layer; and
a second CMOS structure disposed in the substrate and comprising a second layer spaced apart from the first layer by a portion of the substrate disposed between the first layer and the second layer, the portion of the substrate having a resistivity higher than both a resistivity of the first layer and a resistivity of the second layer.

22. The CMOS device of claim 21, wherein a thickness of the portion of the substrate disposed between the first layer and the second layer is greater than a thickness of portions of the substrate other than the portion of the substrate disposed between the first layer and the second layer.

23. The CMOS device of claim 21, wherein the portion of the substrate contacts the first layer and the second layer.

24. The CMOS device of claim 21, wherein a portion of the first layer and a portion of the second layer are flush with a surface of the substrate.

* * * * *